United States Patent [19]

Baehring

[11] Patent Number: 4,587,447
[45] Date of Patent: May 6, 1986

[54] INPUT SIGNAL LEVEL CONVERTER FOR AN MOS DIGITAL CIRCUIT

[75] Inventor: Manfred Baehring, Unterschleissheim, Fed. Rep. of Germany

[73] Assignee: Siemens Aktiengesellschaft, Berlin & Munich, Fed. Rep. of Germany

[21] Appl. No.: 607,267

[22] Filed: May 4, 1984

[30] Foreign Application Priority Data

Jun. 29, 1983 [DE] Fed. Rep. of Germany ....... 3323446

[51] Int. Cl.⁴ .............. H03K 4/58; H03K 17/10; H03K 17/687; H03K 19/094
[52] U.S. Cl. .................. 307/482; 307/475; 307/578; 307/270
[58] Field of Search .......... 307/450, 475, 482, 577, 307/578, 264, 270, 605, 279, 290

[56] References Cited

U.S. PATENT DOCUMENTS

| | | | |
|---|---|---|---|
| 4,071,783 | 1/1978 | Knepper | 307/482 X |
| 4,071,784 | 1/1978 | Maeder et al. | 307/270 X |
| 4,256,974 | 3/1981 | Padgett et al. | 307/270 X |
| 4,346,310 | 8/1982 | Carter | 307/475 X |
| 4,443,715 | 4/1984 | Fox | 307/482 X |
| 4,471,240 | 9/1984 | Novosel | 307/482 X |
| 4,500,799 | 2/1985 | Sud et al. | 307/482 X |
| 4,540,898 | 9/1985 | Pumo et al. | 307/482 X |

Primary Examiner—Stanley D. Miller
Assistant Examiner—David R. Bertelson
Attorney, Agent, or Firm—Hill, Van Santen, Steadman & Simpson

[57] ABSTRACT

An input signal level converter for applying a TTL signal to an actual input of an MOS circuit is required for n-MOS digital circuits controlled with TTL signals. This circuit forms a Schmitt trigger and comprises five MOS field effect transistors and a bootstrap capacitor. The transistors are preferably of the n-channel type and are self-inhibiting. This circuit is improved by means of two further transistors connected such that a quiescent current consumption of the level converter is considerably reduced. Favorable dynamic behavior is achieved without having unfavorable current usage.

4 Claims, 3 Drawing Figures

INPUT SIGNAL LEVEL CONVERTER FOR AN MOS DIGITAL CIRCUIT

BACKGROUND OF THE INVENTION

The invention is concerned with an input signal level converter for an MOS digital circuit which is constructed in n-channel MOS technology together with the MOS digital circuit. The signal input charged by a TTL signal serves for the control of a first and of a second MOS field effect transistor. The source terminal of the first MOS field effect transistor lies at the supply terminal carrying the reference potential and its drain terminal lies at the source terminal of the second MOS field effect transistor on the one hand and is connected, on the other hand, via the source-drain segment of a third MOS field effect transistor to the supply terminal supplying the supply potential. The drain terminal of the second MOS field effect transistor forms the signal output of the converter and is connected to the supply potential via the parallel connection of a fourth MOS field effect transistor and the series connection of a bootstrap capacitor and a fifth MOS field effect transistor wired as a resistor. The signal output is directly connected to the signal input of the MOS digital circuit which employs the same reference potential and the same supply potential as the signal level converter.

A known circuit for an input signal level converter is illustrated in FIG. 1. In order to be able to describe the objective leading to the present invention more precisely, the circuit according to FIG. 1 functioning as a Schmitt trigger will be described. It is preferably constructed with an n-channel MOS field effect transistor of the self-inhibiting type.

The signal input E of the known circuit is present at the gate of a first MOS field effect transistor t1 and at the gate of a second MOS field effect transistor t2 via a dropping resistor R. The source terminal of the first transistor t1 is connected to the supply terminal carrying the reference potential $V_{ss}$ and its drain is connected to the source terminal of the second MOS field effect transistor t2 as well as at the source terminal of a third MOS field effect transistor t3. The drain terminal of the second MOS field effect transistor t2 is connected to the gate of the third MOS transistor t3 on the one hand and—together with the source terminal of the fourth MOS field effect transistor t4—forms the signal output A of the level converter on the other hand. The fourth MOS field effect transistor t4 has its drain at the supply terminal carrying the supply potential $V_{DD}$ and has its gate lying at the source terminal of a fifth MOS field effect transistor t5 whose drain and whose gate are connected to the terminal for the supply potential $V_{DD}$. The connection between the gate and the source of the fourth transistor t4 is realized by a MOS capacitor C which leads to a bootstrap effect. Finally, the signal output A can also be connected to the post for the reference potential $V_{ss}$ by means of a load capacitor (parasitic under given conditions) CL which, for example, is given by the MOS digital circuit to be controlled. This is likewise charged by the supply potential $V_{DD}$ and the reference potential $V_{ss}$ and has its signal input lying at the signal output A of the level converter. The level converter is preferably monolithically combined with the digital MOS circuit (not shown in the Figure). The drain of the third transistor t3 lies at the potential $V_{DD}$.

The following can now be noted in conjunction with the known circuit according to FIG. 1. The circuit serves the purpose of being able to use the data supplied by a bipolar TTL logic for charging an MOS digital circuit, for example a dynamic RAM memory. The standard level of the digital signals supplied from the output of a TTL logic lies at a minimum of 2.4 V in the high condition and at a maximum of 0.8 V in the low condition. For an n-channel MOS circuit, the level $U_{Amax}=V_{DD}$ and the level $U_{Amin}$ is about equal to 0 V. The level conversion should be executed with the lowest possible dissipation and with the lowest possible delay.

The level converter circuit has low input capacitance and a low output voltage (referred to as $V_{ss}$).

The circuit illustrated in FIG. 1, then, guarantees that the output voltage becomes $U_A=V_{DD}$ even given a signal input voltage $U_E=0.8$ V and $U_T<0.8$ V. Due to the bootstrap capacitor C, the gate of the transistor t4 connected to the signal output A to the supply potential $V_{DD}$ receives a sufficiently high voltage in order to hold the transistor t4 in the startup region during the entire switchover operation. The output voltage $U_A$ of the converter can thus obtain the value $V_{DD}$. Furthermore, the dynamic reloading operation of the load capacitor CL is favorably influenced because the internal resistance of an MOS transistor, of course, is lower in the startup region than in the saturation region.

The pre-charging of the bootstrap capacitor C to the voltage value $U_C=V_{DD}-U_T$ ($U_T$=threshold voltage of the MOS field effect transistor) leads, however, to two disadvantageous phenomena:

(a) Since the gate voltage of the MOS transistor t4 is already relatively high ($U_G=V_{DD}-U_T$) in the idle condition ($U_E$=high) and, on the other hand, the output voltage $U_A$ is nonetheless supposed to be as low as possible, an unfavorable proportion of t4 to t2 and t1 of about 1 to 10–20 results for $U_A<0.5$ V (rule of thumb: t4 with 1 W/L = >t2/t1 with 10–20 W/L).

(b) Since the dynamic behavior given fast edges of input signals $U_E$ is defined by the transistor t4 and by the load capacitor CL, a relatively high quiescent current which is essentially defined by the transistor t4 belongs to a given edge slope $t_r$ of the output voltage and to a given load capacitor CL. There is also an input capacitance defined by the gate capacitance of t1 and t2. In conjunction with a dropping resistor R conditioned, for example, by an input protection structure of the monolithically integrated circuit, this can effect a noticeable delay of the output signal $U_A$ relative to the initiating input signal $U_E$.

SUMMARY OF THE INVENTION

It is an object of the invention to specify a circuit for an input signal level converter in accordance with the definition above described which is in a position of avoiding or at least alleviating the two principal disadvantages of the known circuit without having to accept a deterioration in the other properties of the level converter, particularly its dynamic behavior. Two problems must be resolved for this purpose:

(1) In the ideal condition (i.e. $U_E$=high), the gate voltage of the fourth transistor, i.e. of transistor t4, must be noticeably reduced. This means that the supply current flowing across the level converter becomes lower. Furthermore, the first and the second transistor, i.e. the two input transistors t1 and t2, can be dimensioned smaller given a maximum output voltage $U_{A\ Lo\ max}$ corresponding to the low level at the signal output A, so that finally the input capacitance $C_{In}$ is reduced.

(2) On the other hand, as high as possible a pre-charging of the bootstrap capacitor C is desired in order to sufficiently elevate the voltage at the gate of the fourth transistor, i.e. of the transistor t4 given the circuit format shown in FIG. 1 during the switchover operation.

In order to improve the initially defined level converter in the specified sense, the present invention provides a sixth and a seventh MOS field effect transistor. The source terminal of the sixth MOS field effect transistor is directly connected to the drain terminal and its gate is directly connected to the gate of the first MOS field effect transistor. The drain terminal of the sixth MOS field effect transistor is provided both for the control of the gate of the third MOS field effect transistor as well as of the fourth MOS field effect transistor and is also connected to the source terminal of the seventh MOS field effect transistor. The gate and the drain of the seventh MOS field effect transistor both are at the terminal of the bootstrap capacitor facing away from the second MOS field effect transistor as well as at the source of the fifth MOS field effect transistor.

DESCRIPTION OF THE PREFERRED EMBODIMENTS

Figure 2:
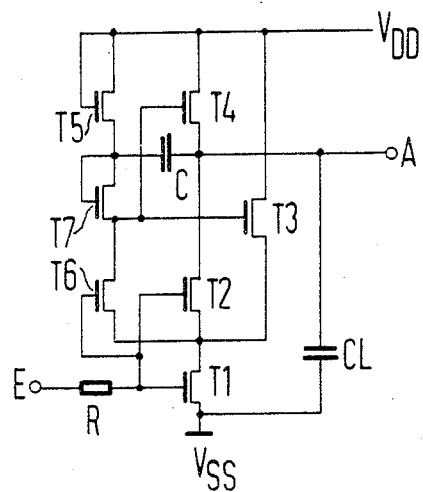
FIG. 2 illustrates an input signal level converter circuit according to the invention.

The circuit of an input signal level converter corresponding to the definition of the invention just provided is illustrated in FIG. 2.

Given the circuit of FIG. 2, the input E for the TTL signal to be processed is applied via a dropping resistor R to the gate of the first MOS field effect transistor T1 as well as to the gate of the second MOS field effect transistor T2. The source terminal of the first MOS field effect transistor T1 thus lies at the reference potential $V_{ss}$ and its drain terminal lies at a node to which the source terminal of the third MOS field effect transistor T3, the source terminal of the second MOS field effect transistor T2, and the source terminal of the sixth MOS field effect transistor T6 are also applied.

Figure 1:
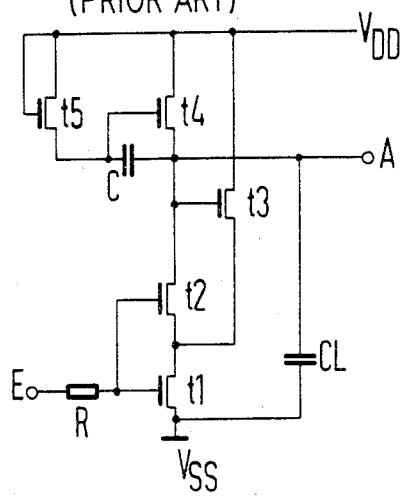
FIG. 1 illustrates a prior art level converter circuit.

The drain terminal of the second MOS field effect transistor T2, similar to the case given the transistor t2 in FIG. 1, is connected to the signal output A of the converter on the one hand as well as to the supply potential $V_{DD}$—via the source-drain segment of a fourth MOS field effect transistor T4—as well as to a further circuit node, via a bootstrap capacitor C. The drain and the gate of the seventh MOS field effect transistor T7 as well as the source terminal of the fifth MOS field effect transistor T5 are directly connected to this node. In coincidence with the transistor t5 in FIG. 1, the gate and the drain terminal of the fifth MOS field effect transistor T5 are applied to the supply potential $V_{DD}$ so that this transistor functions as a resistor. Moreover, the source terminal of the seventh MOS field effect transistor T7 lies at the drain terminal of the sixth MOS field effect transistor T6 and thus at the gate of the third MOS field effect transistor T3 and of the fourth MOS field effect transistor T4 as well.

Just as in the circuit of FIG. 1, a load having an effective capacitance CL can insure a capacitive connection of the signal output A to the reference voltage $V_{ss}$. This is preferably provided by the n-MOS digital circuit to be charged, predominantly monolithically integrated with the level converter and to be controlled via the level converter.

The difference of the circuit according to the invention and of the circuit of FIG. 2 over the circuit of FIG. 1 is the presence of the sixth and of the seventh transistors T6 and T7 as well as by a differing control of the third and of the fourth MOS field effect transistor.

Given the circuit according to the invention, the transistors T5, T6, and T7 form a static voltage divider in their idle condition (i.e. $U_E$=high) which can be dimensioned such that, on the one hand, the voltage at the bootstrap capacitor C is high and the voltage at the gate of the fourth MOS field effect transistor T4 is noticeably lowered. On the other hand, the seventh MOS field effect transistor T7 serving as a resistor should only exhibit a low $U_T$ voltage so that as much as possible of the capacitor voltage arrives at the gate of T4 in the bootstrap case. (It is understandable that a resistor, particularly a resistor comprised of polysilicon, could be employed under given conditions instead of the seventh MOS field effect transistor T7.)

When the voltage of the signal to be applied between the post for the reference potential $V_{ss}$ and the input post E, i.e. the voltage $U_E$, becomes lower than the sum of the source voltage of T6 and $U_T$, then the gate voltage of T4 rises to the value of the voltage $U_C$ at the bootstrap capacitor C. An increase of the output voltage $U_A$ is thus produced, whereby the gate voltage of T4 is elevated via the bootstrap capacitor C. This means that the dynamic properties of the level converter of FIG. 2 suffer no noticeable deterioration.

For a comparative, dynamic network simulation of the circuit according to the invention, the W/L ratio of the transistors T1–T7 was dimensioned as follows: T1=50, T2=50, T3=5, T4=10, T5=18, T6=6, T7=1. The bootstrap capacitor C—preferably an MOS capacitor—was dimensioned to a value of 350 fF. A load capacitance CL of 0.5 pF was assumed for the simulation. The post for $V_{DD}$ is at +5 V in the traditional manner (for n-channel technique). For the reason specified above, the transistor T7 has a lower threshold voltage $U_T$ than the remaining transistors of the level converter.

Figure 3:
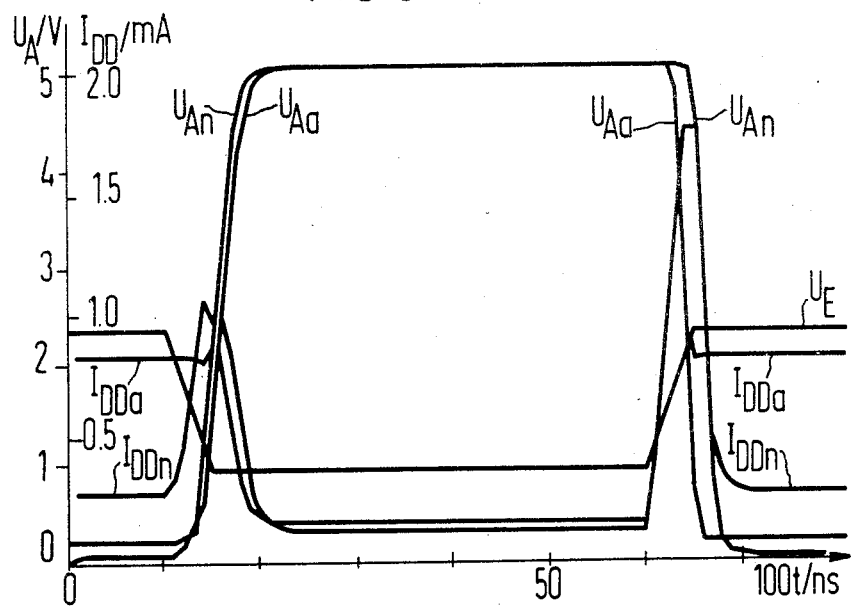
FIG. 3 illustrates a chronological progression of input voltage, output voltage, and supply current.

FIG. 3 shows the chronological progression of the input voltage $U_E$, of the output voltage $U_A$, and of the supply current $I_{DD}$ obtained under the specified conditions.

If the known circuit illustrated in FIG. 1 is to be matched to the circuit of FIG. 2 with respect to its dynamic behavior, then the W/L ratios must be t1=90 (whereby t1 would have to have a greater gate length in the interest of the $U_T$ boost required there), t2=125, t3=7, t4=5, and t5=1. The bootstrap capacitor C would have to be set to 250 fF. Given the same load capacitance CL as was employed in order to obtain the behavior shown in FIG. 3, then the behavior likewise shown in FIG. 3 and given by the curve $U_{A\,a}$ is obtained on the basis of the TTL level adjacent to the signal input E of the circuit of FIG. 1.

One can see the difference between the input capacitances of the two circuits from the different values of the transistors to whose gate the TTL input voltage $U_E$ is applied in the two cases under comparison. (A ratio of 400 fF/1200 fF in favor of the circuit according to the invention results with the transistor parameters and values on which the simulation is based.

Regarding the curves referenced $I_{DDa}$ and $I_{DDn}$ in FIG. 3, the curve $I_{DDa}$ shows the current progression of the known circuit and the curve $I_{DDn}$ shows the current progression of the circuit according to the invention.

It can be seen from FIG. 3 that, given an identical edge slope of the output voltages of the earlier circuit of FIG. 1 and the circuit according to the invention of FIG. 3, the quiescent current acquisition of the invention version is about ⅔ lower (i.e. 0.27 mA:0.81 mA) in comparison to the known circuit. Furthermore, the low level obtained at the output A given the circuit according to the invention is lower than in the case of the earlier circuit.

Although various minor changes and modifications might be proposed by those skilled in the art, it will be understood that I wish to include within the claims of the patent warranted hereon all such changes and modifications as reasonably come within my contribution to the art.

I claim as my invention:

1. An input signal level converter for combination with an MOS digital circuit comprising:
    a signal input for connection to a TTL signal and connected for control of first and second MOS field effect transistors;
    a source terminal of the first transistor being connected to reference potential and its drain terminal connecting to a source terminal of the second transistor and also through a source-drain path of a third MOS field effect transistor to a supply potential;
    a drain terminal of the second transistor connecting to a signal output of the converter, and connecting to the supply potential via a parallel connection of a fourth MOS field effect transistor and a series connection of a bootstrap capacitor and a fifth MOS field effect transistor connected as a resistor;
    the signal output being directly connected to a signal input of said MOS digital circuit, said MOS digital circuit having a same reference potential and a same supply potential as the signal level converter;
    sixth and seventh MOS field effect transistors;
    a source terminal of the sixth transistor connecting to a drain terminal of the first transistor and its gate being connected to a gate of the first transistor;
    a drain terminal of the sixth transistor being connected to a gate of the third transistor, a drain terminal of the seventh transistor, and a gate of the fourth transistor; and
    a source terminal of the seventh transistor connecting to said bootstrap capacitor, and also connecting to a source terminal of the fifth transistor, and a gate of the seventh transistor connecting to its source terminal.

2. The converter claim 1 wherein the converter is constructed of N-channel MOSFETs.

3. The level converter according to claim 1 wherein said level converter is monolithically integrated.

4. An input signal level converter for use with an MOS digital circuit, comprising:
    a signal input connected to gates of first and second MOS field effect transistors;
    the first and second transistors being connected in series and a third MOS field effect transistor having a source-drain path connected between a supply potential and a junction between the first and second transistors;
    the source-drain paths of the first, second, and a fourth MOS field effect transistor being connected in series between the supply potential and a reference potential;
    an output connected at a junction between the second and fourth transistors;
    a gate of the third transistor connecting between the second and fourth transistors;
    a bootstrap capacitor connected in series with a fifth MOS field effect transistor between the output and the supply potential;
    a gate of the fourth transistor connecting between the capacitor and fifth transistor and a gate of the fifth transistor connecting to the supply potential;
    a series connection of sixth and seventh MOS field effect transistors connecting between the bootstrap capacitor and a junction between the first and second transistors;
    a gate of the sixth transistor connecting to the gate of the first and second transistors; and
    a gate of the seventh transistor connecting to the bootstrap capacitor.

* * * * *